(12) United States Patent
Fujisawa

(10) Patent No.: US 7,161,865 B2
(45) Date of Patent: Jan. 9, 2007

(54) SEMICONDUCTOR DEVICE

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 96 days.

(21) Appl. No.: 10/994,412

(22) Filed: Nov. 23, 2004

(65) Prior Publication Data

US 2005/0117433 A1 Jun. 2, 2005

(30) Foreign Application Priority Data

Nov. 27, 2003 (JP) ............................ 2003-396650

(51) Int. Cl.
*G11C 5/14* (2006.01)
*H03L 7/00* (2006.01)

(52) U.S. Cl. .................. 365/226; 327/141; 327/142; 327/143; 327/530

(58) Field of Classification Search ................ 327/141, 327/142, 143, 530; 365/226; 361/235
See application file for complete search history.

(56) References Cited

U.S. PATENT DOCUMENTS 6,356,488 B1 * 3/2002 Kang .................... 365/189.09
6,366,506 B1 * 4/2002 Mizuno et al. ........ 365/189.09
6,483,357 B1 * 11/2002 Kato et al. .................. 327/143

FOREIGN PATENT DOCUMENTS

JP H08-65131 A 3/1996

OTHER PUBLICATIONS

T. Sakata, et al DDDR/SDR- Compatible SDRAM Design with a Three-size Flexible Column Redunadancy, 2000 Symposium on VLSI Circuits Digest of Technical Paper, IEEE, 2000, p. 116-119.
C. Yoo, et al., "A 1.8V 700 Mb DDR-II SDRAM with On die Termination and Off-Chip Driver Calibration" 2003 IEEE International Sokid State Circuits Conference.

* cited by examiner

*Primary Examiner*—Amir Zarabian
*Assistant Examiner*—Ly Duy Pham
(74) *Attorney, Agent, or Firm*—Sughrue Mion, PLLC

(57) ABSTRACT

A high-density DDR-1/DDR-2 compatible SDRAM chip with a reduced output circuit area is provided. When the SDRAM is a DDR1 SDRAM, an output signal output from an output circuit (14) is output to an output terminal (17) as a main output signal. When the SDRAM is a DDR2 SDRAM, an output signal output from an output circuit (15) is output to the output terminal (17) as the main output signal and, at the same time, the output signal output from the output circuit (14) is output as a sub-output signal to perform operation for adjusting the slew rate or the amount of output current of the main output signal or for adjusting the impedance of the output terminal as viewed from an external point.

19 Claims, 7 Drawing Sheets

US 7,161,865 B2

SEMICONDUCTOR DEVICE

FIELD OF THE INVENTION

The present invention relates to a semiconductor device, and ore particularly to a semiconductor device with a plurality of output circuits one of which is selected according to a supplied power.

BACKGROUND OF THE INVENTION

There is an increasing need for a high-density, high-speed, and low-power consumption SDRAM (Synchronous Dynamic Random Access Memory), which is one of popular semiconductor memories, with its generation evolving from SDR (single-data-rate) to DDR (double-data-rate). The generation of DDR is also evolving from DDR-1 to DDR-2. Furthermore, DDR-3 is expected to be put on the market as the next-generation DDR. Those DRAM generations differ primarily in the voltage of the supplied power. In particular, the power supply voltage of the data output unit is 2.5V for DDR-1 and 1.8V for DDR-2. The power supply voltage of the next-generation DDR-3 is expected to be 1.5V or lower.

On the other hand, there is a concept of developing a shared chip in which the internal circuits of SDRAM are shared across the generations of SDRAM with only the input/output circuit changed according to the generation. For example, Non-Patent Document 1 discloses a SDR/DDR compatible SDRAM. Sharing the circuits and educing the new design work in the shared parts lowers the development costs of a chip.

Patent Document 1 also discloses an output circuit that works at different power supply voltages and prevents the operation speed from being decreased, the power consumption from being increased, and a failure from occurring.

Non-Patent Document 2 discloses an example of the output circuit of a DDR-2 SDRAM. To output a high-speed output signal, a DDR-2 SDRAM is required to keep the waveform, the output impedance, and the amount of current of the output signal within those defined by the specifications. To meet these requirements, it is configured so that the signal for adjusting the output signal is output in synchronization with the output signal. For example, the output of the OCD (Off-chip driver) adjustment circuit that adjusts the amount of current of the output signal and the output of the ODT (On-die termination) adjustment circuit that terminates the output terminal (DQ bus) using a non-access chip are sent to the output terminal in synchronization with the major output of the output circuit.

[Non-Patent Document 1]
T. Sakata, et al., "A DDR/SDR-Compatible SDRAM Design with a Three-Size Flexible Column Redundancy," 2000 Symposium on VLSI Circuits Digest of Technical Papers, IEEE, 2000, p. 116–119.

[Non-Patent Document 2]
C. Yoo, et al., "A 1.8V 700 Mb DDR-II SDRAM with On-die Termination and Off-Chip Driver Calibration", 2003 IEEE International Solid State Circuits Conference, IEEE, 2003, p. 312, p. 313, p. 495.

[Patent Document 1]
Japanese Patent Kokai Publication No. JP-A-8-65131 (FIG. 1).

The entire disclosures of the above prior art documents are incorporated herein by reference thereto.

Although an SDRAM allowing SDR and DDR to share the circuits for operation is conventionally disclosed, an SDRAM allowing DDR-1 an DDR-2 to share the circuits for operation is not know. To satisfy this need, one possible solution is to configure an SDRAM in which DDR-1 and DDR-2 share the internal circuits and each of DDR-1 and DDR-2 has its own output circuit. This configuration results in an increase in the output circuit size. Therefore, a high-density semiconductor chip with a reduced output circuit size cannot be fabricated by a combination of conventional technologies.

SUMMARY OF THE DISCLOSURE

In view of the foregoing, it is an object of the present invention to reduce the size of the output circuit of a semiconductor device that receives one of at least two different power supply voltages and to provide a high-density semiconductor device.

According to a first aspect of the present invention there is provided a semiconductor device to which one type of power supply selected from at least two different types of power supply voltages is supplied. The semiconductor device comprises an output terminal and at least two output circuits for the one output terminal. The output circuits are configured as follows. When a first power supply voltage is supplied to the semiconductor device, an output signal of a first output circuit is output to the output terminal. When a second power supply voltage is supplied to the semiconductor device, both the output signal of the first output circuit and an output signal of a second output circuit, which synchronizes with the output signal of the first output circuit, are output to the output terminal.

According to a second aspect of the present invention there is provided a semiconductor device to which one type of power supply selected from at least two different types of power supply voltage is supplied. The semiconductor device comprises an output terminal and at least three output circuits for the one output terminal. When a first power supply voltage is supplied to the semiconductor device, both an output signal of a first output circuit and an output signal of a third output circuit, which synchronizes with the output signal of the first output circuit, are output to the output terminal. The output circuits are configured as follows. When a second power supply voltage is supplied to the semiconductor device, both the output signal of the first output circuit and an output signal of a second output circuit, which synchronizes with the output signal of the first output circuit, are output to the output terminal.

According to a third aspect of the present invention there is provided a semiconductor device to which one type of power supply selected from at least two different types of power supply voltage is supplied. The semiconductor device comprises an output terminal, a first output circuit whose output is connected to the output terminal, an output signal generation circuit that generates a signal that is a source of a signal output from the output terminal, a level conversion circuit that converts a voltage level of the signal output from the output signal generation circuit, a second output circuit that receives the signal output from the output signal generation circuit, and an adjustment control circuit that generates an adjustment signal from the signal output from the output signal generation circuit. The semiconductor device is further formulated as follows. When a first power supply voltage is supplied to the semiconductor device, the output of the level conversion circuit is input to the first output circuit. When a second power supply voltage is supplied to the semiconductor device, an output signal of the second output circuit is output to the output terminal and, at the same time, the adjustment signal output from the adjustment control circuit is supplied to the first output circuit to allow an output signal output from the first output circuit to adjust the output signal output from the second output circuit.

The meritorious effects of the present invention are summarized as follows.

The semiconductor device according to the present invention enables a semiconductor device, to which one type of power supply selected from at least two different types of power supply voltage is supplied, to share the output circuit, thus reducing the area of the output circuit on the semiconductor device and making it possible to fabricate a high-density semiconductor device chip.

PREFERRED EMBODIMENTS OF THE INVENTION

Figure 1:
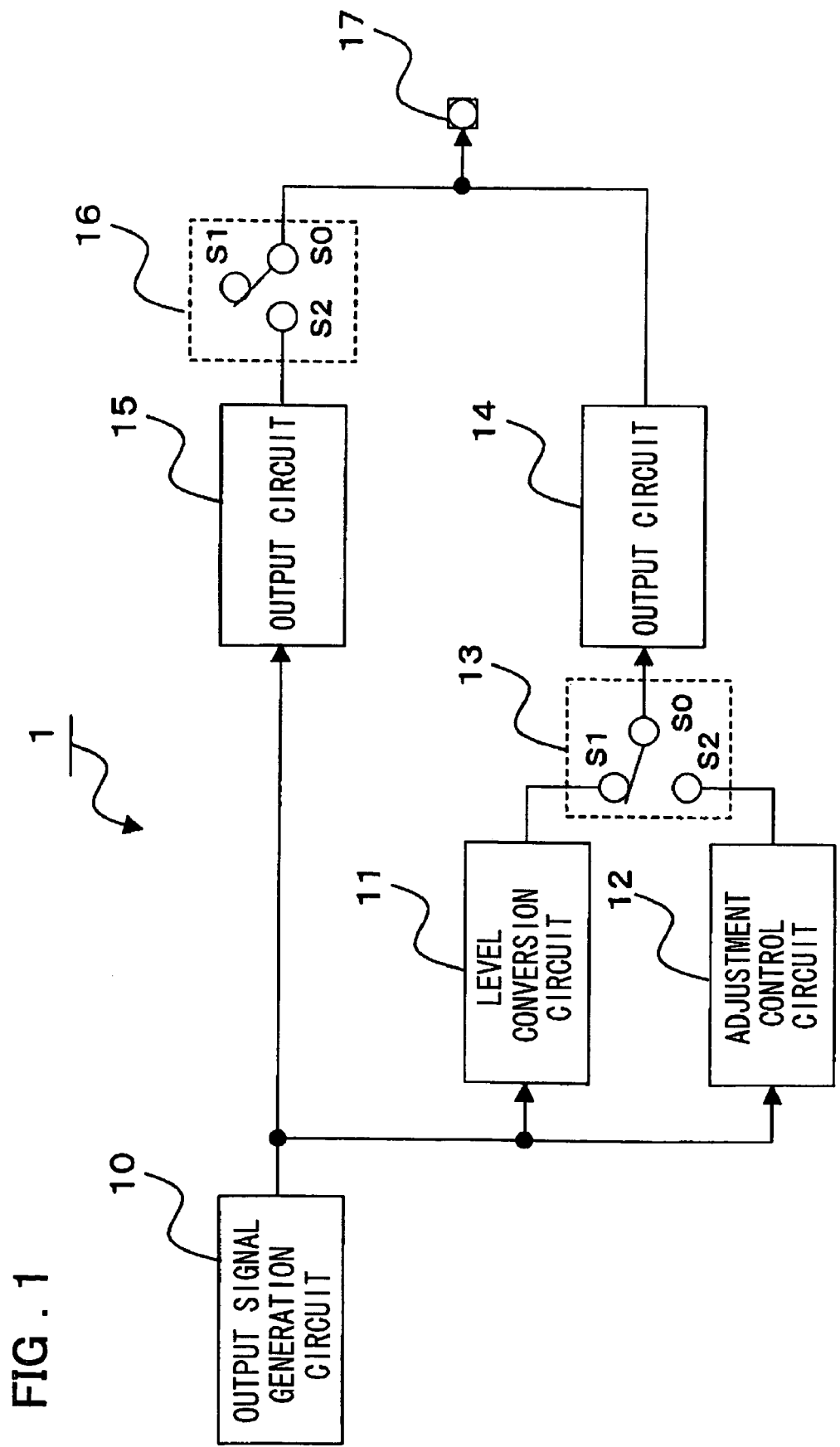
FIG. 1 is a block diagram showing a semiconductor device in an embodiment of the present invention.

Next, the present invention will be described below with reference to the drawings. FIG. 1 is a block diagram of a semiconductor device in an embodiment of the present invention. Referring to FIG. 1, a semiconductor device 1, which receives one power supply selected from at least two types of different power supply voltages, comprises an output terminal 17, a first output circuit 14 whose output is connected to the output terminal 17, an output signal generation circuit 10 that generates a signal that is the source of the signal output to the output terminal 17, a level conversion circuit 11 that converts (change-over) the voltage level of the signal output from the output signal generation circuit 10, a second output circuit 15 that receives the signal output from the output signal generation circuit 10, and an adjustment control circuit 12 that generates an adjustment signal from the signal output from the output signal generation circuit 10.

The semiconductor device 1 further comprises a switch 13. When the semiconductor device 1 receives a first power supply voltage, contact S0 and contact S1 of the switch 13 are connected (closed) to send the output of the level conversion circuit 11 to the first output circuit 14.

The semiconductor device 1 further comprises a switch 16. When the semiconductor device 1 receives a second power supply voltage, contact S0 and contact S2 of the switch 16 are connected to output the output signal, which is received from the second output circuit 15, to the output terminal 17. Then, contact S0 and contact S2 of the switch 13 are connected to supply the adjustment signal, which is output from the adjustment control circuit 12, to the first output circuit 14 so that the output signal output from the first output circuit 14 can adjust the output signal output from the second output circuit 15. With the switches set as shown in FIG. 1, the semiconductor device 1 receives the first power supply voltage.

The semiconductor device 1 is configured as described above. When the semiconductor device 1 receives the first power supply voltage, the output signal output from the output circuit 14 becomes the main output signal that is output to the output terminal 17. When the semiconductor device 1 receives the second power supply voltage, the output signal output from the output circuit 15 becomes the main output signal that is output to the output terminal 17 and, at the same time, the output signal output from the output circuit 14 becomes the sub-output signal for adjusting the main output signal.

That is, when the semiconductor device 1 receives the first power supply voltage, the output circuit 14 is used as the output circuit that outputs the main output signal; when the semiconductor device 1 receives the second power supply voltage, the output circuit 14 is used as the output circuit that outputs the sub-output signal used for adjustment. In this way, this configuration allows the output circuit 14 to be shared and therefore reduces the size of the entire output circuit configuration.

[First Embodiment]

Figure 2:
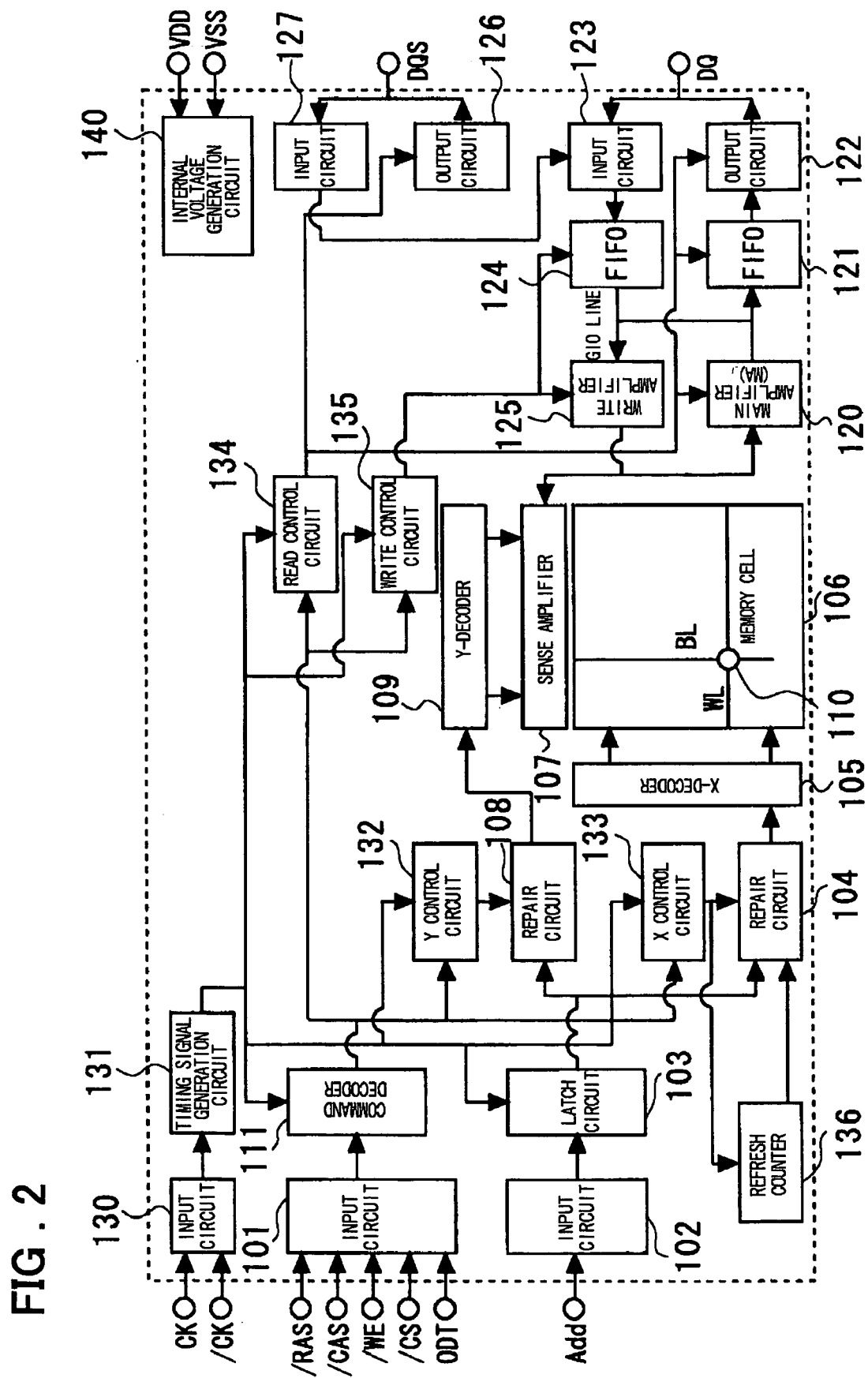
FIG. 2 is a diagram showing an example of a whole block configuration of a DDR SDRAM.

A DDR SDRAM will be described as an example in which the present invention is applied. FIG. 2 is a diagram showing an example of the whole block configuration of a DDR SDRAM. In the description below, the symbol "/" indicates an inversion bar (over-bar) to show that the low level is an active level.

The control input signals are a row address strobe signal /RAS, a column address strobe signal /CAS, a write enable signal /WE, a chip select signal /CS, and an on-die termination adjustment signal ODT. Those signals are input to an input circuit 101. The signals output from the input circuit 101 are sent to a command decoder 111 in synchronization with a timing signal generated by a timing signal generation circuit 131 and, based on the decoding result, distributed to an X control circuit 133, a Y control circuit 132, a read control circuit 134, and a write control circuit 135.

Clock signals CK and /CK are input to an input circuit 130. A timing signal generation circuit 131 generates various timing signals required for selecting a memory cell such as an address-signal fetch control timing signal received on a time series basis in synchronization with the clock signals CK and /CK and a sense amplifier operation timing signal. The timing signals generated by the timing signal generation circuit 131 are distributed to a latch circuit 103, the command decoder 111, the X control circuit 133, the Y control circuit 132, the read control circuit 134, and the write control circuit 135.

An X address signal and a Y address signal are input from a common address terminal Add to an input circuit 102. The X address signal and the Y address signal, received via the address buffer in the input circuit 102, are both stored into the latch circuit 103 based on the timing signal output from the timing signal generation circuit 131. The X address signal stored into the latch circuit 103 is pre-decoded, and the output signal of the latch circuit 103 is supplied to an X-decoder 105 via a repair circuit 104 to form a signal that selects the word line WL in a memory array 106. When the word line selection operation is performed, a weak read signal appears on the complementary bit line BL of the memory array 106 and is amplified by a sense amplifier 107.

The Y address signal stored into the latch circuit 103 is pre-decoded, and the output signal of the latch circuit 103 is supplied to a Y-decoder 109 via a repair circuit 108 to form a selection signal of the bit line BL.

The X repair circuit 104 and the Y repair circuit 108, which store failed addresses, compare stored failed addresses with the stored address signal described above. If they match, the repair circuit 104 or 108 instructs the X-decoder 105 or the Y-decoder 109 to select a reserved word line or a reserved bit line, respectively, and inhibits the regular word line or the regular bit line from being selected, respectively.

The stored information amplified by the sense amplifier 107 and selected by a column switch circuit not shown is connected to a common input/output line and is sent to a main amplifier circuit 120. During the read operation, this main amplifier circuit 120 amplifies the read signal, which is read via the column switch circuit, according to the instruction of the read control circuit 134 and sends an amplified signal to an FIFO 121. In the FIFO 121, the read signal, which is time-adjusted by the timing signal from the read control circuit 134, is amplified by an output circuit 122 and is output from a pad DQ to be wired to an external terminal.

The write operation, though not directly related to the present invention, is performed as follows. During the write operation, a write signal received from the pad DQ is fetched via an input circuit 123, an FIFO 124, and a write amplifier 125, and is sent to the common input/output line and the select bit line. The write signal is sent to the select bit line through the amplification operation of the sense amplifier 107, and the corresponding charge is stored in the capacitor of a memory cell 100 in the memory array 106.

The pad DQS is a pad through which the strobe signal is input and output. During the read operation, the timing signal generated by the read control circuit 134 is output from an output circuit 126 to the pad DQS to act as the timing signal of the signal output from the pad DQ. During the write operation, the strobe signal input from the pad DQS is used as the timing signal of the write signal input from the pad DQ.

An internal power supply generation circuit 140 receives an operating voltage or voltages, such as VDD and VSS, supplied from a power supply terminal, and generates various internal voltages, for example, a precharge voltage such as a plate voltage VDD/2, an internal boosted voltage VPP, an internal low voltage VDL, and a substrate back-bias voltage VBB. A voltage of 2.5V is supplied across VDD and VSS when the SDRAM is a DDR1 SDRAM, and 1.8V when the SDRAM is a DDR2 SDRAM.

When the mode is set to a refresh mode, a refresh counter 136 generates an address signal for the refresh operation for use in the X-selection operation.

Figure 3:
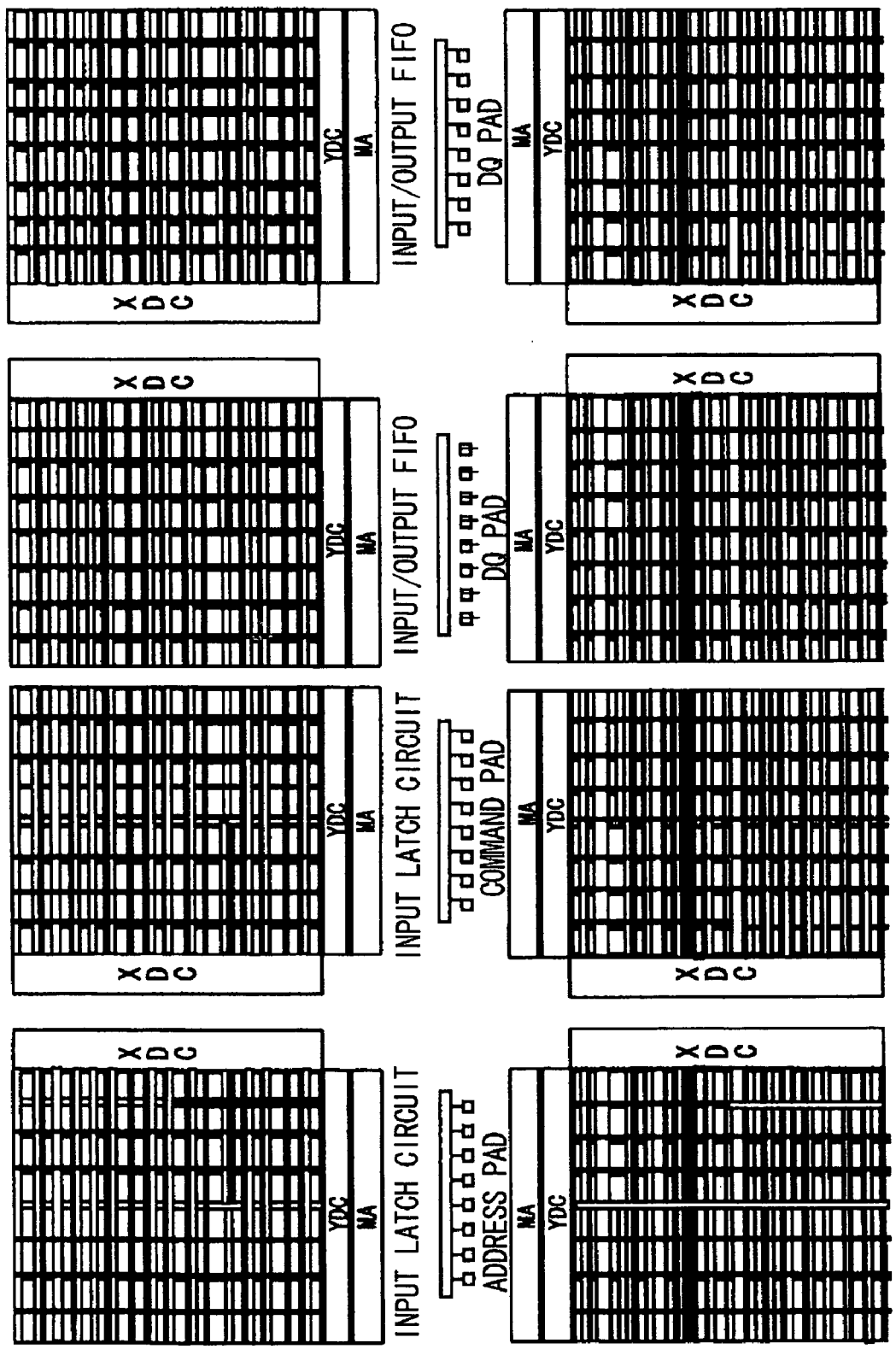
FIG. 3 is a diagram showing a configuration of a whole chip of a DDR SDRAM.

FIG. 3 is a diagram showing the configuration of a whole DDR SDRAM chip. Referring to FIG. 3, the SDRAM chip is divided into eight blocks to create a plurality of memory blocks or banks. The eight blocks have the same configuration. An X-decoder XDC is provided along one side of each memory array, and a Y-decoder YDC and a main amplifier MA are provided in the direction orthogonal to the X-decoder XDC and approximately in the center of the chip. The eight memory blocks are grouped into pairs of memory blocks, arranged vertically and symmetrically with their X-decoders XDCs adjacent each other to form one memory bank. Two memory banks, each composed of a pair of memory blocks, are also arranged vertically and symmetrically as shown in FIG. 3. The Y-decoder YDC and the main amplifier MA are arranged along/on both sides of the peripheral circuits, provided horizontally in the center of the chip, so that they are adjacent to each other and vertically symmetrical.

The hierarchical word line system is used for the memory array part of one memory block. In this system, the memory array part comprises a plurality of arrays created by dividing the memory block by the word lines extending horizontally from the X-decoder XDC in FIG. 3, sub-word lines each provided for each of the arrays, and a main word line provided through a plurality of arrays, and the selection of the sub-word lines is conducted by the sub-word line selection line. This configuration reduces the number of memory cells connected to a sub-word line and therefore increases the speed of the selection operation of the sub-word line.

The memory block described above has a plurality of arrays created by dividing the memory block by the Y selection lines extending from the Y-decoder YDC, with the bit line being divided per each array. This configuration reduces the number of memory cells connected to the bit line, and the voltage of a signal read from a memory cell to the bit line is secured. A memory cell is composed of a dynamic memory cell, and whether or not the storage capacitor stores a charge corresponds to 1 and 0. Because the read operation is performed by the charge coupling between the charge of the storage capacitor and the pre-charged charge of the bit line, the required amount of signal voltage can be secured by reducing the number of memory cells connected to the bit line.

The sub-word driver columns are provided to the left and right, and the sense amplifier columns are provided above and below (in the bit line direction), of an array created by dividing the memory block. The sense amplifier column includes a column selection circuit and a bit line precharge circuit. When a memory cell is selected by the word line (sub-word line) and data is read from the cell, the sense amplifier senses a weak potential appearing on the respective bit lines and amplifies the sensed potential.

A main input/output line MIO, though not limited to the configuration described herein, is provided by vertically extending the line from the sub-word driver column in FIG. 3. A local input/output line LIO is provided along the sense amplifier column, and the local I/O line LIO and the main I/O line MIO are connected by a row selection signal. A global I/O line GIO, provided in the peripheral circuit, is connected to the main I/O line MIO corresponding to the selected memory bank. The global I/O line GIO is connected to the pad DQ wired to an external terminal through the input/output FIFO and via the output circuit and the input circuit.

Although not shown, the peripheral circuits described below are provided as necessary in the center of a chip. The address signal supplied from the address input terminal (address PAD) is stored into the input latch circuit in synchronization with an external clock signal. After that, it is stored into the row address buffer circuit and the column address buffer circuit according to the command in the address multiplex format. The supplied address signal is held in each address buffer. For example, the row address buffer and the column address buffer each hold the stored address signal for one memory cycle period. A repair circuit composed of a fuse and an MOSFET for address comparison and so on is provided in the center of the chip.

The row address buffer receives the refresh address signal, output from the refresh control circuit in the refresh operation mode, as the row address signal. In this example, though not limited to the operation described herein, the refresh address signal is received as the row address signal via the clock generation circuit. The address signal stored in the column address buffer is supplied to the column address counter, included in the control circuit, as preset data. According to the operation mode specified by a command described later, the column address counter outputs the column address signal supplied as the preset data or a value generated by sequentially incrementing the column address signal to the Y-decoder YDC.

The control circuit receives external control signals, such as the clock signal, clock enable signal, chip select signal column address strobe signal, row address strobe signal, write enable signal and data input/output mask control signal, and the address signal corresponding to a memory bank. Note that the signals received by the control circuit are not limited to those described above. The control circuit generates various control signals, such as the DDR SDRAM operation mode control signal etc., and various corresponding timing signals based on the level change or the timing of signals. The control circuit has the control logic and a mode register for that purpose.

The 4N (N=8 in this example) pre-fetch operation is performed for the DDR SDRAM shown in FIG. 3. That is, the two memory arrays of one memory bank described above are divided into address 0 (Y0=0, Y1=0), address 1 (Y0=1, Y1=1), address 2 (Y0=0, Y1=1), and address 3 (Y0=1, Y1=1) for the main input/output line MIO according to the Y0 and Y1 addresses. During the read operation, a total of 32 bits, i.e., 16 bits from each memory array, are selected corresponding to the column address signal and 32-bit data is output using the global I/O line GIO.

In addition, the output circuit outputs the eight bits of address 0 on the rising edge of the first clock signal CK, the eight bits on the falling edge of the first clock signal, the eight bits on the rising edge of the second clock signal, and the remaining eight bits on the falling edge of the second clock signal.

This embodiment is applied, but not limitatively, to a DDR SDRAM with a large storage capacity such as about 256M bits. The chip is divided into eight memory blocks, and each two blocks form one bank. One memory block is divided into 8×16 arrays (sub-mat), each submat being composed of 512×512 bits. That is, 512 memory cells are connected to one sub-word line and 512 memory cells are connected to the bit line. In the description below, the main input/output line MIO is abbreviated as an MIO line using the circuit symbol MIO, and the global I/O line GIO is abbreviated as a GIO line using the circuit signal GIO.

In the circuit diagram shown in FIG. 2, the main amplifier circuit 120, the FIFO 121, the GIO line, and output circuit 122 are assigned for addresses 0/1/2/3, respectively. Data is transferred from the main amplifier circuit 120 to the output circuit 122 at the same time for addresses 0/1/2/3. That is, the 32-bit data read into the MIO line is sensed simultaneously by the main amplifier circuit 120 and is transferred to the output circuit 122 in parallel. The data is output from the output circuit 122 synchronous to the rising edge and the falling edge of the clock signal corresponding to Y0 and Y1 of the start address. Therefore, in this case, the main amplifier circuit 120 and the GIO line perform operation for the 32 bits at the same time.

Figure 4:
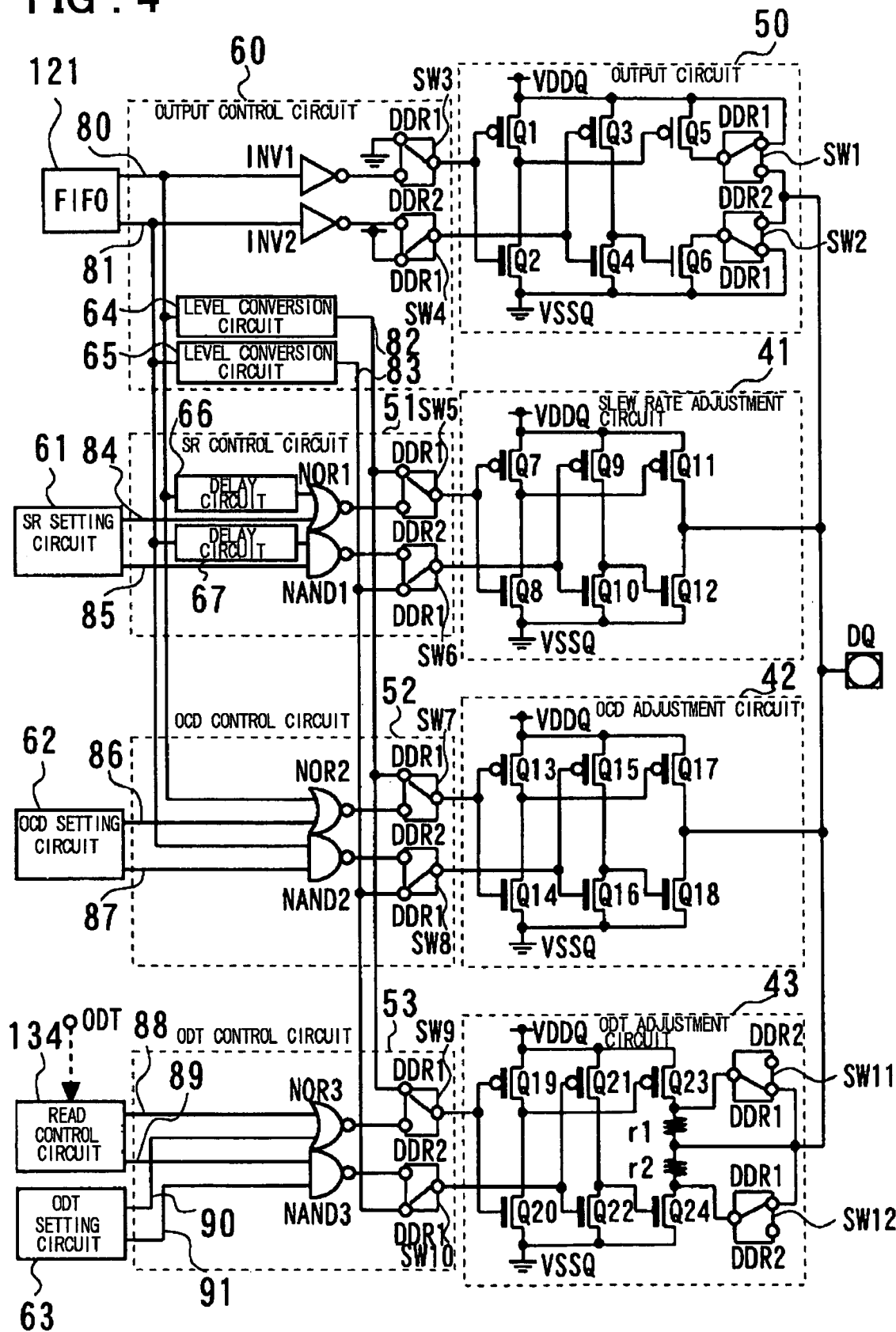
FIG. 4 is a circuit diagram showing of an output circuit configuration of a DDR1-1/DDR-2 compatible SDRAM chip in a first embodiment of the present invention.

Next, the following describes an embodiment of the data output circuit of a DDR-1/DDR-2 compatible SDRAM chip that is applied to the SDRAM described above. FIG. 4 is a circuit diagram showing the output circuit of a DDR-1/DDR-2 compatible SDRAM in a first embodiment of the present invention. Referring to FIG. 4, the compatible SDRAM chip comprises a pad DQ connected to the output terminal of the chip, an output control circuit 60, an output circuit 50, a slew rate adjustment circuit 41, an OCD adjustment circuit 42, an ODT adjustment circuit 43, an SR control circuit 51, an OCD control circuit 52, an ODT control circuit 53, an SR setting circuit 61, an OCD setting circuit 62, and an ODT setting circuit 63.

The circuit shown in FIG. 4 is applicable to the output circuit 122 shown in FIG. 2. In FIG. 4, two types of MOS registers with different voltage resistance levels (a transistor with a gate indicated by a thick line is a high-breakdown voltage transistor and a transistor with a gate indicated by a thin line is a low-breakdown voltage transistor) are combined, and the output circuit is switched-over depending upon whether the SDRAM is DDR1 or DDR2. The switch SWn (n=1 to 12) is a switch (metal switch) for switching the metal wiring layer. The switch is connected to the DDR1 side when the SDRAM is a DDR1 SDRAM, and to the DDR 2 side when the SDRAM is a DDR2 SDRAM.

First, the following describes the output circuit 50. The signal read from the FIFO 121 is output as signals 80 and 81 that are inverted from one to another (i.e., 180 degrees out-of-phase). The signals 80 and 81 are buffered in the inverter circuits INV1 and INV2 in the output control circuit 60. When the SDRAM is a DDR2 SDRAM, the signals are input to the gates of transistors Q1 and Q2 and the gates transistors Q3 and Q4 in the output circuit 50 via the switches SW3 and SW4 respectively.

The source of the transistor Q1, which is a PMOS transistor, is connected to the power supply VDDQ, and its drain is connected to a drain of the transistor Q2 which is an NMOS transistor. The source of the transistor Q2, which is an NMOS transistor, is connected to the ground, that is, VSSQ, and the drain is connected to a drain of the transistor Q1 and to the gate of the transistor Q5 which is a low-voltage PMOS transistor. The source of the transistor Q5 is connected to the power supply VDDQ. The drain of the transistor Q5 is connected to the switch SW1 and is connected to the power supply VDDQ when the SDRAM is a DDR1 SDRAM and to the pad DQ when the SDRAM is a DDR2 SDRAM.

Similarly, the source of the transistor Q3, which is a PMOS transistor, is connected to the power supply VDDQ, and the drain is connected to a drain of the transistor Q4 which is an NMOS transistor. The source of the transistor Q4, which is an NMOS transistor, is connected to the ground, that is, VSSQ, and the drain is connected to the drain of the transistor Q3 and to the gate of the transistor Q6 which is a low-voltage NMOS transistor. The source of the transistor Q6 is connected to the ground, that is, VSSQ. The drain of the transistor Q6 is connected to the switch SW2 and is connected to the ground when the SDRAM is a DDR1 SDRAM or to the pad DQ when the SDRAM is a DDR2 SDRAM, respectively.

The output circuit 50 is configured as described above. When the SDRAM is a DDR1 SDRAM, the circuit functions as if it was apparently not connected to any component; when the SDRAM is a DDR2 SDRAM, the circuit amplifies the read signal output from the FIFO 121 and outputs the amplified signal to the pad DQ.

Low-voltage MOS transistors are used for the MOS transistor Q5 and Q6 in the last stage of the output circuit 50 to enhance the current characteristics when VDDQ of DDR2 is 1.8V. In this case, when the SDRAM is a DDR-1 SDRAM, the switch (metal switch) that switches the metal wiring (interconnection) layer is used to disconnect the transistors from the pad DQ to prevent a high voltage from being applied. On the other hand, the high-breakdown voltage MOS transistors are used for the MOS transistors Q1, Q2, Q3, and Q4 which are in the stage preceding the output MOS transistors Q5 and Q6. This eliminates the need for individually disconnecting the MOS transistors Q1, Q2, Q3, and Q4 in the preceding stage using the metal switch when the SDRAM is a DDR1 SDRAM, thus simplifying the layout.

On the other hand, the signals 80 and 81 are input to level conversion circuits 64 and 65 in the output control circuit 60 respectively and are converted to signals for DDR2. The outputs 82, 83 of the level conversion circuits 64 and 65 are connected to switches SW5, SW7, and SW9 and switches SW6, SW8, and SW10, respectively.

The signals 80 and 81 are also input to delay circuits 66 and 67 in the SR control circuit 51 respectively, and the delayed signals are input to a NOR circuit NOR1 and an NAND circuit NAND1 respectively. In addition, the signals 80 and 81 are input to a NOR circuit NOR2 and a NAND circuit NAND2 in the OCD control circuit 52 respectively.

The SR setting circuit 61 is a circuit for setting the slew rate of the signals output from the pad DQ. When signals 84 and 85 output from the SR setting circuit 61 are high and low respectively, the signals delayed by the delay circuits 66 and 67 are output to switches SW5 and SW6 respectively. When the SDRAM is a DDR2 SDRAM, the delayed signals are input also to the slew rate adjustment circuit 41 respectively.

The slew rate adjustment circuit 41, which includes transistors Q7 to Q12, is configured in the same manner as the output circuit 50. They differ in that the switches corresponding to the switches SW1 and SW2 are not provided, that the transistors Q11 and Q12 are high-breakdown voltage transistors, and that the drain of the transistor Q11 and the drain of the transistor Q12 are both connected to the pad DQ.

The SR control circuit 51 and the slew rate adjustment circuit 41 are configured as described above. When the SDRAM is a DDR1 SDRAM, the output signals 82 and 83 of the level conversion circuits 64 and 65 are amplified by the slew rate adjustment circuit 41 and output to the pad DQ. When the SDRAM is a DDR2 SDRAM, the signals 80 and 81 output from the FIFO 121 are delayed by the delay circuits 66 and 67 and are output from the slew rate adjustment circuit 41 to adjust the slew rate of the signals output from the output circuit 50 to the pad DQ.

The slew rate is the slope of the rise/fall of a waveform at the pad DQ when data is output. The upper limit and the lower limit of the slew rate are defined by the specifications. This slew rate adjustment circuit is a circuit that adjusts the slew rate when the slew rate varies because of manufacturing variations. The slew rate adjustment circuit 41 employs a circuit configuration widely used, for example, in a Rambus DRAM (trademark of Rambus, Inc). In operation, data output from the FIFO 121 is delayed for a predetermined time by the delay circuits 66 and 67 and then transferred to the slew rate adjustment circuit 41 to allow out-of-phase (phase-shifted) signals to be output from the slew rate adjustment circuit 41 and the output circuit 50 at the same time. The slope of the rise and the fall of a waveform at the pad DQ can be fine-tuned by adjusting the ratio between the driving characteristics of the slew rate adjustment circuit 41 and that of the output circuit 50 in advance. Therefore, as compared with the output circuit 50, the performance required for the slew rate adjustment circuit 41 is lower, because it is required only to satisfy the current characteristics according to the adjustment width of a slew rate variation. That is, it is possible to use a high-breakdown voltage MOS transistor, which is poor in the current characteristics, in the output stage.

On the other hand, the slew rate adjustment circuit 41 configured by high-breakdown voltage MOS transistors is used as an output circuit during DDR-1 operation. In this case, when the voltage of the internal circuits of the chip is decreased to 1.8V during DDR-1 operation, the level conversion circuits 64 and 65 convert the voltage level of the data output signal, received from the FIFO 121, from 1.8V to 2.5V and transfer the signals to the slew rate adjustment circuit 41. Therefore, the slew rate adjustment circuit 41 can be used the output circuit for the DDR-1 operation and, at the same time, as an adjustment circuit for the DDR-2 operation.

The OCD setting circuit 62 is a circuit for setting the adjustment of the amount of current of the signals output from the pad DQ. When signals 86 and 87 output from the OCD setting circuit 62 are high and low respectively, the signals 80 and 81 are output to the switches SW7 and SW8 respectively. In addition, when the SDRAM is a DDR2 SDRAM, the signals 80 and 81 are input to the OCD adjustment circuit 42 via the switches SW7 and SW8 respectively.

The OCD adjustment circuit 42, which includes transistors Q13 to Q18, is configured in the same manner as the slew rate adjustment circuit 41. The drain of the transistor Q17 and the drain of the transistor Q18 are both connected to the pad DQ.

The OCD control circuit 52 and the OCD adjustment circuit 42 are configured as described above. When the SDRAM is a DDR1 SDRAM, the signals 82 and 83 output respectively from the level conversion circuits 64 and 65 are amplified by the OCD adjustment circuit 42 and are output to the pad DQ. When the SDRAM is a DDR2 SDRAM, the signals 80 and 81 output from the FIFO 121 are output from the OCD adjustment circuit 42 to adjust the amount of current of the signals that are output from the output circuit 50 to the pad DQ.

The specifications for the adjustment of the OCD adjustment circuit 42 are proposed, for example, by JEDEC STANDARD JESD79-2 (issued by JEDEC SOLID STATE TECHNOLOGY ASSOCIATION), the entire disclosure thereof being herein incorporated by reference thereto. For example, the adjustment width is from 8 to 16 steps, and the upper limit and the lower limit are defined by the specifications.

Although there is one OCD adjustment circuit 42 in FIG. 4, several OCD adjustment circuits 42 are usually provided to allow the OCD setting circuit 62 to determine how many of the several OCD adjustment circuits are to be activated. The amount of current output from the pad DQ is determined by the number of OCD adjustment circuits to be activated and the output current characteristics of each OCD adjustment circuit. The OCD adjustment circuit adjusts variations in the current characteristics generated because of manufacturing variations. Therefore, as compared with the output transistor of the output circuit 50, the performance required for the OCD adjustment circuit 42 is lower, because it is required only to satisfy the current characteristics according to the adjustment range of variations. That is, it is possible to use a high-breakdown voltage MOS transistors, which are poor in the current characteristics, in the output stage. On the other hand, the OCD adjustment circuit 42 configured by high-breakdown voltage MOS transistors is used as the output circuit during the DDR-1 operation as in the SR adjustment circuit 41.

The ODT setting circuit 63 is a circuit that sets the adjustment for terminating the bus, to which the pad DQ is connected, using a non-access chip. The on-die termination adjustment signal ODT, one of SDRAM control input signals, is generated as signals 88 and 89, which are 180 degrees out of phase, from the read control circuit 134 and are input to a NOR circuit NOR3 and a NAND circuit NAND3 in the ODT control circuit 53, respectively. When signals 90 and 91 output from the ODT setting circuit 63 are high and low, respectively, the signals 88 and 89 are output to switch SW9 and switch SW10 respectively. In addition, when the SDRAM is a DDR2 SDRAM, the signals 88 and 89 are input to the ODT adjustment circuit 43 via the switch SW9 and switch SW10 respectively.

The ODT adjustment circuit 43, which includes transistors Q19 to Q24, is configured in the same manner as the slew rate adjustment circuit 41. However, note that the drain of the transistor Q23 is connected to the pad DQ and to switch SW11 via a resistor r1. Also, the drain of the transistor Q24 is connected to the pad DQ via a resistor r2 and to the switch SW12. When the SDRAM is a DDR1 SDRAM, the drains of the transistors Q23 and 24 are both connected to the pad DQ via the switch SW11 and switch SW12, respectively. In addition, when the SDRAM is a DDR2 SDRAM, the pad DQ is connected to the power supply VDDQ or the ground VSSQ via the resistor r1 or the resistor r2, respectively.

The ODT adjustment circuits 43 and the ODT control circuit 53 are configured as described above. When the SDRAM is a DDR1 SDRAM, the output signals 82 and 83 of the level conversion circuits 64 and 65 are amplified by the ODT adjustment circuit 43 and output to the pad DQ. On the other hand, when the SDRAM is a DDR2 SDRAM, the DQ bus is terminated by the resistor r1 or resistor r2 according to whether the signal ODT is high or low. In this case, whether to terminate the DQ bus is determined by the output of the read control circuit 134. This makes it possible to terminate the pad DQ as necessary when the DDR2 SDRAM is a non-access chip.

Although there is one ODT adjustment circuit 43 in FIG. 4, several ODT adjustment circuits 43 are usually provided to allow the ODT setting circuit 63 to determine how many of the several ODT adjustment circuits are to be activated. The ODT adjustment circuit 43 is a circuit that terminates the line of the pad DQ using a non-access chip, and the upper limit and the lower limit of the current characteristics are defined, for example, by JEDEC described above. The ODT adjustment circuit 43 uses a circuit configuration widely used for DDR2 SDRAM. In operation, how many ODT adjustment circuits 43 are to be activated is determined by the ODT setting circuit 63. After that, the ODT adjustment circuit 43 is put into operation via the read control circuit 134 in response to an input from the ODT pin. The output characteristics of the ODT adjustment circuit 43 are determined primarily by the resistance characteristics, and the MOS transistors Q23 and 24 are used as switches. Therefore, as compared with the output circuit 50, the performance required for the current characteristics of the ODT adjustment circuit 43 is lower. Therefore, it is possible to use a high-breakdown voltage MOS transistor. On the other hand, the ODT adjustment circuit 43 configured by high-breakdown voltage MOS transistors is used as the output circuit during DDR-1 operation as with the slew rate adjustment circuit 41 and the OCD adjustment circuit 42.

As described above, the circuit in FIG. 4 operates as follows. When the SDRAM is a DDR1 SDRAM, the signal read from the FIFO 121 is output to the pad DQ via the slew rate adjustment circuit 41, OCD adjustment circuit 42, and ODT adjustment circuit 43. That is, the slew rate adjustment circuit 41, OCD adjustment circuit 42, and ODT adjustment circuit 43 perform the function of the output circuit. When the SDRAM is a DDR2 SDRAM, the signal read from the FIFO 121 is output to the pad DQ via the output circuit 50. At the same time, the slew rate adjustment circuit 41, the OCD adjustment circuit 42, and the ODT adjustment circuit 43 work together to adjust the signal output to the pad DQ and terminate the bus when the SDRAM is a non-access chip.

Therefore, the output circuit for DDR1 and the adjustment circuit for DDR2 are commonly (or jointly) used to reduce the size of the output circuit on the chip.

[Second Embodiment]

Figure 5:
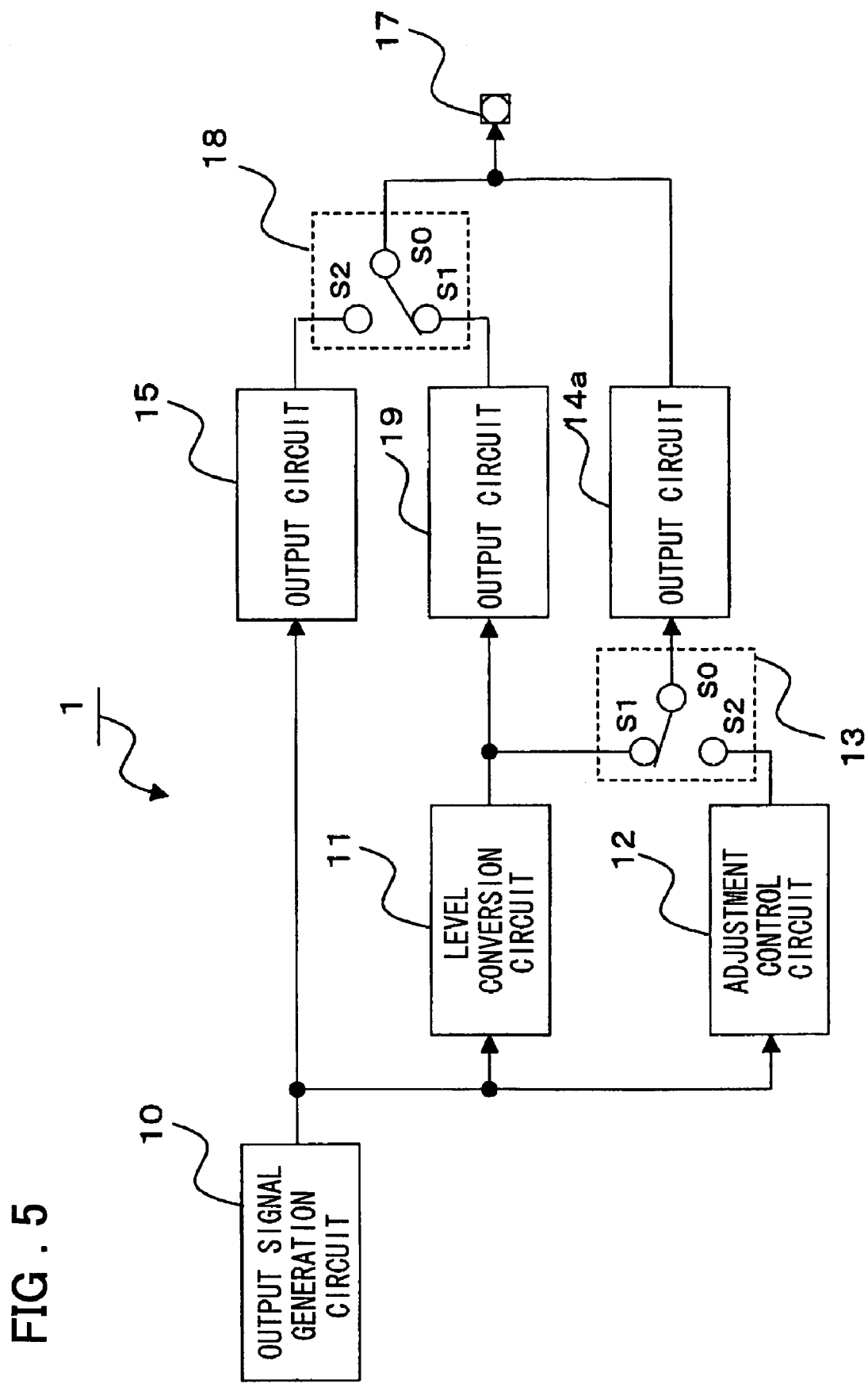
FIG. 5 is a block diagram showing a semiconductor device in a second embodiment of the present invention.

Next, the following describes an example in which a special output circuit is provided and a part of the adjustment circuit for DDR2 is combined with the output circuit when the SDRAM is a DDR1 SDRAM. FIG. 5 is a block diagram showing a semiconductor device in a second embodiment of the present invention. In FIG. 5, the same reference numerals as those in FIG. 1 denote the same structural elements. The following primarily describes the new elements, but obviating the explanation of the elements with the same reference numerals. A semiconductor device 1 comprises a third output circuit 19 and a switch 18. The output of a level conversion circuit 11 is connected to a third output circuit 19, and the output of the third output circuit 19 is connected to contact S1 of the switch 18. The switch 18 is the same as the switch 16 in FIG. 1 except the connection of contact S1. A first output circuit 14a has a function similar to that of the first output circuit 14 in FIG. 1 except that, when the semiconductor device 1 receives a first power supply voltage, a part of the output function is assigned to the third output circuit 19.

When the semiconductor device 1 receives the first power supply voltage in FIG. 5, contacts S0 and S1 of the switch 18 are connected to output the output signal received from the third output circuit 19 to the output terminal 17. That is, the output signal of the level conversion circuit 11 is input to both the first output circuit 14a and the third output circuit 19, and both the output signal of the first output circuit 14a and the output signal of the third output circuit 19 are output to the output terminal 17. On the other hand, when the semiconductor device 1 receives a second power supply voltage, the configuration is the same as that of the device described in FIG. 1. The state of the switches in FIG. 5 indicates that the semiconductor device 1 receives the first power supply voltage.

As described above, the semiconductor device in the second embodiment of the present invention uses both the first output circuit 14a and the third output circuit 19 to implement the output function when the semiconductor device 1 receives the first power supply voltage.

Therefore, when the semiconductor device 1 in FIG. 1 is a device receiving the first power supply voltage, the semiconductor device in the second embodiment is useful when it is difficult for the first output circuit 14 to implement all the output function because of the circuit layout and the wiring and there is a need for disconnecting a part of the first output circuit 14.

Figure 6:
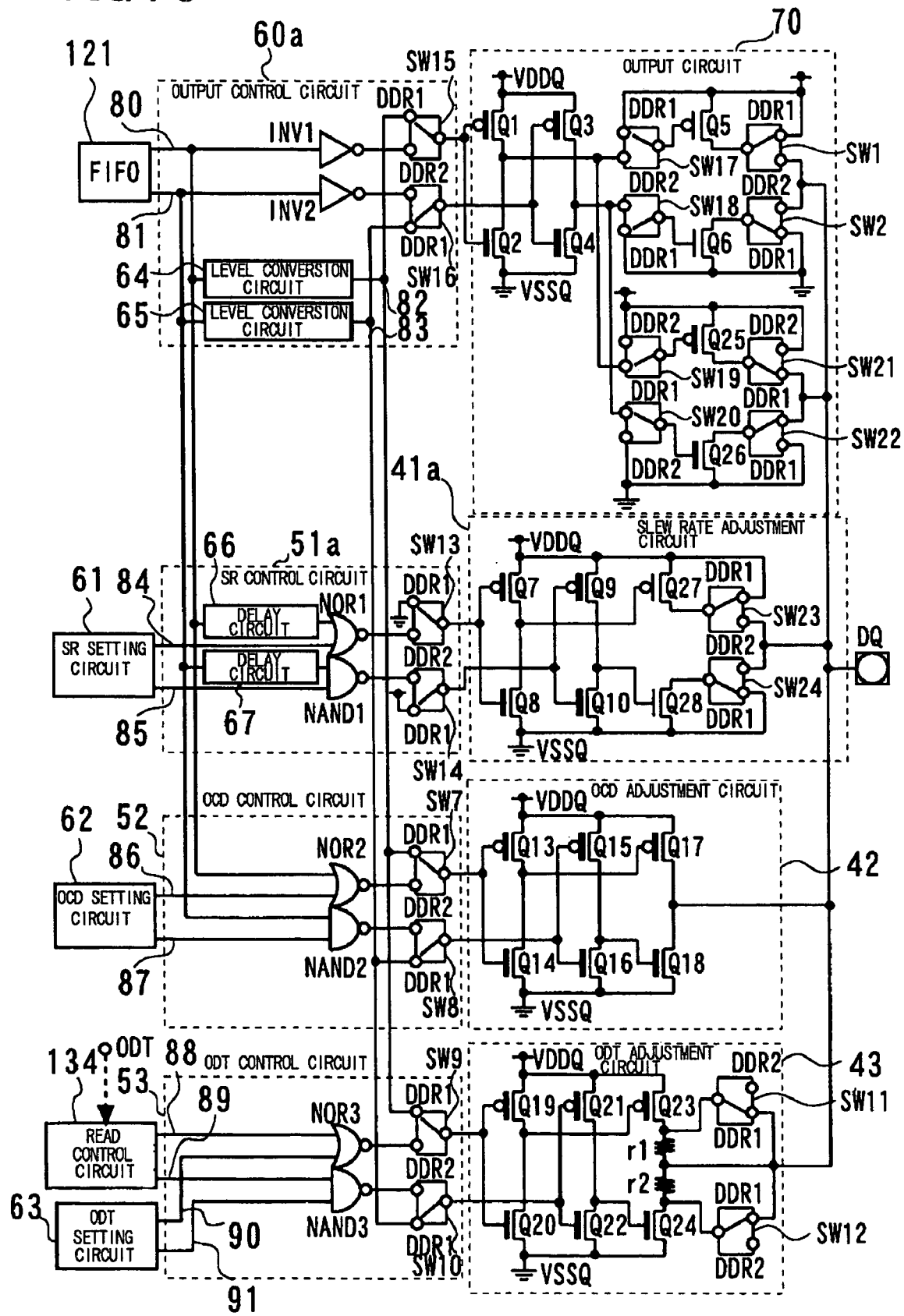
FIG. 6 is a circuit diagram showing an output circuit configuration of a DDR1-1/DDR-2 compatible SDRAM chip in the second embodiment of the present invention.

Next, the following describes an example of the detailed circuit for implementing the function shown in the block diagram in FIG. 5. FIG. 6 is a circuit diagram showing the output circuit of the DDR-1/DDR-2 SDRAM compatible chip in the second embodiment of the present invention. In the circuit shown in FIG. 6, the same reference numerals as those in FIG. 4 denote the same or equivalent structural elements. The following primarily describes the new elements, without mentioning the elements with the same reference numerals.

As compared with the output circuit 50, an output circuit 70 has additional components including switches SW17, SW18, SW19, SW20, SW21, and SW22, and transistors Q25 and Q26. When the SDRAM is a DDR2 SDRAM, the output circuit 70 functions in the same way the output circuit 50 functions. Switches SW1, SW2, SW17, and SW18 are connected to the DDR2 side, and the drains of transistors Q5 and Q6 are connected to the pad DQ.

When the SDRAM is a DDR1 SDRAM, the drains of transistors Q1 and Q2 are connected to the gate of the high-breakdown voltage PMOS transistor Q25 via the switch SW19. The drains of transistors Q3 and Q4 are connected to the gate of the high-voltage NMOS transistors Q26 via the switch SW20. The drains of the transistors Q25 and Q26 are connected to the pad DQ via the switches SW21 and SW22.

In an output control circuit 60a, the switches SW3 and SW4 of the output control circuit 60 in the first embodiment are replaced respectively by switches SW15 and SW16. When the SDRAM is a DDR2 SDRAM, the output of the level conversion circuits 64 and 65 are input to the output circuit 70 via the switches SW15 and SW16.

The output circuit 70 and the output control circuit 60a are configured as described above. When the SDRAM is a DDR1 SDRAM, the transistors Q25 and Q26 perform the function of the output stage of the last stage. When the SDRAM is a DDR2 SDRAM, the transistors Q5 and Q6 perform the output stage of the last stage and the signal read from the FIFO 121 is amplified and output to the pad DQ.

On the other hand, in a slew rate adjustment circuit 41a, the transistors Q11 and Q12 of the slew rate adjustment circuit 41 in the first embodiment are replaced by low-breakdown voltage transistors Q27 and Q28 and switches SW23 and SW24 are provided. When the SDRAM is a DDR1 SDRAM, the drains of the transistors Q27 and Q28 are connected to the power supply VDDQ and the ground VSSQ, respectively. When the SDRAM is a DDR2 SDRAM, the drains of the transistor Q27 and Q28 are connected to the pad DQ, respectively, via the switch SW23 and SW24, respectively.

In an SR control circuit 51a, the switches SW5 and SW6 of the SR control circuit 51 in the first embodiment are replaced by the switches SW13 and SW14. When the SDRAM is a DDR1 SDRAM, the gates of the transistors Q7 and Q8 in the slew rate adjustment circuit 41a are connected to the ground by the switch SW13 and the gates of the transistors Q9 and Q10 in the slew rate adjustment circuit 41a are connected to the power supply VDDQ by the switch SW14, respectively.

The slew rate adjustment circuit 41a and the SR control circuit 51a are configured as described above. When the SDRAM is a DDR1 SDRAM, the slew rate adjustment circuit 41a functions as if it was not connected to any component; when the SDRAM is a DDR2 SDRAM, the slew rate adjustment circuit 41a functions as a slew rate adjustment circuit.

As described above, when the SDRAM is a DDR1 SDRAM in the circuit shown in FIG. 6, the signal read from the FIFO 121 is output to the pad DQ via the output circuit 70, OCD adjustment circuit 42, and ODT adjustment circuit 43. That is, the output circuit 70, OCD adjustment circuit 42, and ODT adjustment circuit 43 perform the function of the output circuit. When the SDRAM is a DDR2 SDRAM, the signal read from the FIFO 121 is output to the pad DQ via the output circuit 70. At the same time, the slew rate adjustment circuit 41a, the OCD adjustment circuit 42, and the ODT adjustment circuit 43 work together to adjust the signal output to the pad DQ and terminate the bus when the SDRAM is a non-access chip.

Therefore, the output circuit for DDR1 and a part of the adjustment circuit for DDR2 are commonly used as an output circuit to reduce the size of the output circuit on the chip.

[Third Embodiment]

Figure 7:
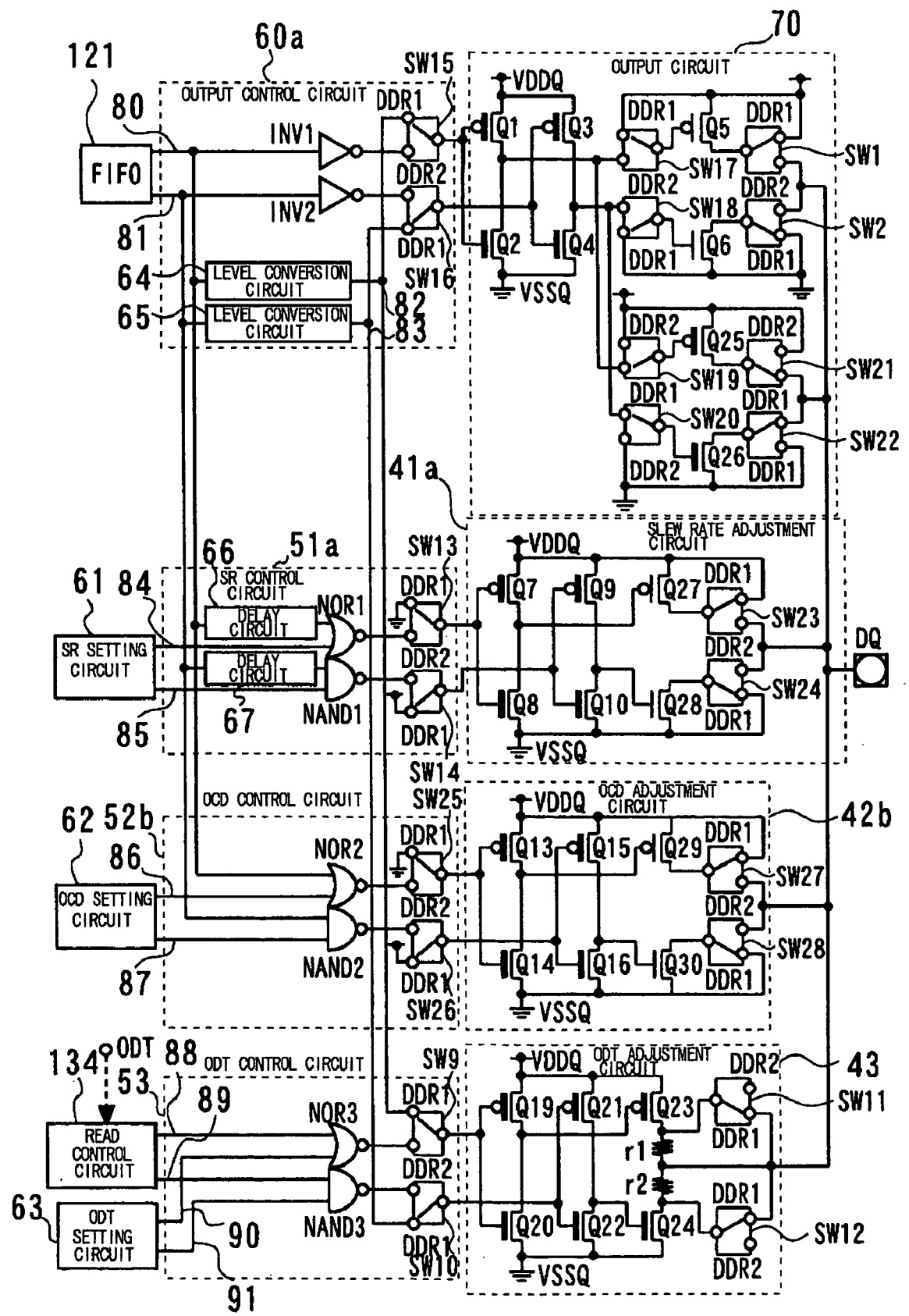
FIG. 7 is a circuit diagram showing an output circuit configuration of a DDR1-1/DDR-2 compatible SDRM chip in a third embodiment of the present invention.

Next, the following describes another example of a detailed circuit that implements the function of the block diagram shown in FIG. 5. FIG. 7 is a circuit diagram showing the output circuit of a DDR-1/DDR-2 compatible SDRAM chip in a third embodiment of the present invention. In the circuit shown in FIG. 7, the same reference numerals as those in FIG. 6 denote the same or equivalent structural elements. The following primarily describes the new elements, but not the elements with the same reference numerals.

In an OCD adjustment circuit 42b, the transistors Q17 and Q18 of the OCD adjustment circuit 42 in the first embodiment are replaced, respectively, by low-breakdown voltage transistor Q29 and Q30 and switches SW27 and SW28 are provided. When the SDRAM is a DDR1 SDRAM, the drains of the transistors Q29 and Q30 are connected to the power supply VDDQ and the ground VSSQ, respectively; when the SDRAM is a DDR2 SDRAM, the drains of the transistors Q29 and Q30 are connected to the pad DQ via the switches SW27 and SW28, respectively.

In an OCD control circuit 52b, the switches SW7 and SW8 of the OCD control circuit 52 in the first embodiment are replaced by the switches SW25 and SW26. When the SDRAM is a DDR1 SDRAM, the gates of the transistors Q13 and Q14 in the OCD adjustment circuit 42b are connected to the ground by the switch SW25 and the gates of the transistors Q15 and Q16 in the OCD adjustment circuit 42b are connected to the power supply VDDQ by the switch SW26.

The OCD adjustment circuit 42b and the OCD control circuit 52b are configured as described above. When the SDRAM is a DDR1 SDRAM, the OCD adjustment circuit 42b functions as if it was not connected to any component; when the SDRAM is a DDR2 SDRAM, the OCD adjustment circuit 42b functions as an OCD adjustment circuit 42.

As described above, when the SDRAM is a DDR1 SDRAM in the circuit shown in FIG. 7, the signal read from the FIFO 121 is output to the pad DQ via the output circuit 70 and the ODT adjustment circuit 43. That is, the output circuit 70 and the ODT adjustment circuit 43 perform the function of the output circuit. When the SDRAM is a DDR2 SDRAM, the signal read from the FIFO 121 is output to the pad DQ via the output circuit 70. At the same time, the slew rate adjustment circuit 41a, the OCD adjustment circuit 42b, and the ODT adjustment circuit 43 work together to adjust the signal output to the pad DQ and terminate the bus when the SDRAM is a non-access chip.

Therefore, the output circuit for DDR1 and a part of the adjustment circuit for DDR2 are commonly used as the output circuit to reduce the size of the output circuit on the chip.

As described above, when the SDRAM is a DDR1 SDRAM, the function of outputting the read signal to the pad DQ is performed all by the slew rate adjustment circuit 41, OCD adjustment circuit 42, and ODT adjustment circuit 43 in the example in FIG. 4, in part by the OCD adjustment circuit 42 and ODT adjustment circuit 43 in the example in FIG. 6, and in part by the ODT adjustment circuit 43 in the example in FIG. 7. It should be noted that which one of the slew rate adjustment circuit 41, OCD adjustment circuit 42, and ODT adjustment circuit 43 is responsible for performing the function of outputting the read signal to the pad DQ is not limited to the example given above but that various combinations are possible. This combination may be selected as necessary according to the layout or wiring (interconnection) of the circuits on the chip.

Next, the following describes the area of the output circuit on the chip. In the output circuit, the MOS transistor in the last output stage connected to a pin external to the chip, that is, to an external terminal, requires a high driving power, meaning that the ratio of the area of the last-stage transistors to the whole area of the output circuit is high. When calculating the area assuming that the area of the last-stage transistor, from which the output signal is supplied to the pad DQ, is 1, the ratio of the areas of the components shown in FIG. 4 is approximately Transistors Q5, Q6:Transistors Q11, Q12:Transistors Q17, Q18:Transistors Q23, Q24=1:0.33:0.33:0.33 with the total being about 2. In FIG. 6, Transistors Q5, Q6 Transistors Q25, Q26:Transistors Q27, Q28:Transistors Q17, Q18:Transistors Q23, Q24=1:0.33:0.33:0.33:0.33 with the total being about 2.3. In FIG. 7, Transistors Q5, Q6 Transistors Q25, Q26:Transistors Q27, Q28:Transistors Q29, Q30:Transistors Q23, Q24=1:0.66:0.33:0.33:0.33 with the total being about 2.7.

By contrast, when the output circuit is prepared for DDR-1 and DDR-2 individually, Output transistors for DDR-1:Output transistors for DDR-2:Adjustment circuit output transistors for DDR-2=1:1:1 (=0.33+0.33+0.33) with the total being about 3. Therefore, as shown in FIG. 4, FIG. 6, and FIG. 7, the area of the output circuit can be reduced by using a part or the whole of the adjustment circuit for DDR-2 as the output circuit for DDR-1.

The development cost of the chip can be reduced by sharing the circuits in the semiconductor chip and by reducing the chip size.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device to which one type of power supply selected from at least two different types of power supply voltages is supplied, said semiconductor memory device comprising:
   an output terminal; and
   at least two output circuits for said one output terminal, wherein said output circuits are configured such that:
      when a first power supply voltage is supplied to said semiconductor memory device, an output signal of a first output circuit is output to said output terminal, and
      when a second power supply voltage is supplied to said semiconductor memory device, both the output signal of said first output circuit and an output signal of a second output circuit, which synchronizes with the output signal of said first output circuit, are output to said output terminal.

2. A semiconductor memory device to which one type of power supply selected from at least two different types of power supply voltages is supplied, said semiconductor memory device comprising:
   an output terminal; and
   at least three output circuits for said one output terminal, wherein said output circuits are configured such that:
      when a first power supply voltage is supplied to said semiconductor memory device, both an output signal of a first output circuit and an output signal of a third output circuit, which synchronizes with the output signal of said first output circuit, are output to said output terminal, and
      when a second power supply voltage is supplied to said semiconductor memory device, both the output signal of said first output circuit and an output signal of a second output circuit, which synchronizes with the output signal of said first output circuit, are output to said output terminal.

3. The semiconductor memory device as defined by claim 1, wherein said first output circuit outputs a main output signal when the first power supply voltage is supplied and said first output circuit outputs a sub-output signal when the second power supply voltage is supplied.

4. The semiconductor memory device as defined by claim 2, wherein said first output circuit outputs a main output signal when the first output supply voltage is supplied and said first output circuit outputs a sub-output signal when the second power supply voltage is supplied.

5. The semiconductor memory device as defined by claim 3, wherein said second output circuit outputs the main output signal when the second power supply voltage is supplied and wherein the sub-output signal is a signal for adjusting the main output signal.

6. The semiconductor memory device as defined by claim 4, wherein said second output circuit outputs the main output signal when the second power supply voltage is supplied and wherein the sub-output signal is a signal for adjusting the main output signal.

7. The semiconductor memory device as defined by claim 5, wherein the sub-output signal is a signal for adjusting at least one of a slew rate or an amount of output current of the main output current of the main output signal or an impedance of said output terminal as viewed from an external point of said output terminal.

8. The semiconductor memory device as defined by claim 6, wherein the sub-output signal is a signal for adjusting at least one of a slew rate or an amount of output current of the main output signal or an impedance of said output terminal as viewed from an external point of said output terminal.

9. The semiconductor memory device as defined by claim 1, wherein when the second power supply voltage is supplied, said first output circuit comprises a circuit for adjusting a slew rate or an amount of output current of the output signal of said second output circuit or an output impedance of said output terminal as viewed from an external point of said output terminal.

10. The semiconductor memory device as defined by claim 2, wherein when the second power supply voltage is supplied, said first output circuit comprises a circuit for adjusting a slew rate or an amount of output current of the output signal of said second output circuit or an output impedance of said output terminal as viewed from an external point of said output terminal.

11. The semiconductor memory device as defined by claim 1, wherein when the first power supply voltage is supplied, said second output circuit does not output the output signal and, when the second power supply voltage is supplied, outputs a main output signal.

12. The semiconductor memory device as defined by claim 2, wherein when the first power supply voltage is supplied, said second output circuit does not output the output signal and, when the second power supply voltage is supplied, outputs a main output signal.

13. A semiconductor memory device to which one type of power supply selected from at least two different types of power supply voltage is supplied, said semiconductor memory device comprising:
    an output terminal;
    a first output circuit whose output is connected to said output terminal;
    an output signal generation circuit that generates a signal that is a source of a signal output to said output terminal;
    a level conversion circuit that converts a voltage level of the signal output from said output signal generation circuit;
    a second output circuit that receives the signal output from said output signal generation circuit; and
    an adjustment control circuit that generates an adjustment signal from the signal output from said output signal generation circuit,
    wherein said semiconductor memory device is configured such that:
        when a first power supply voltage is supplied to said semiconductor memory device, the output of said level conversion circuit is input to said first output circuit, and
        when a second power supply voltage is supplied to said semiconductor memory device, an output signal of said second output circuit is output to said output terminal and, at the same time, the adjustment signal output from said adjustment control circuit is supplied to said first output circuit to allow an output signal output from said first output circuit to adjust the output signal output from said second output circuit.

14. The semiconductor memory device as defined by claim 13, further comprising:
    a third output circuit that receives the output of said level conversion circuit,
    wherein when the first power supply voltage is supplied to said semiconductor memory device, an output of said third output circuit is supplied to said output terminal.

15. The semiconductor memory device as defined by claim 13, wherein said first output circuit comprises:
    a slew rate adjustment circuit that adjusts a slew rate of the output signal output from said second output circuit;
    an output current adjustment circuit that adjusts an amount of current output from said output terminal; and
    an output impedance adjustment circuit that adjusts an impedance of said output terminal as viewed from an external point,
    wherein when the first power supply voltage is supplied to said semiconductor memory device, at least one of said slew rate adjustment circuit said output current adjustment circuit, and said output impedance adjustment circuit receives the output signal converted by said level conversion circuit for driving said output terminal, and
    wherein when the second power supply voltage is supplied to said semiconductor memory device, said slew rate adjustment circuit, said output current adjustment circuit, and said output impedance adjustment circuit drive said output terminal for adjusting the output signal output from said second output circuit.

16. The semiconductor memory device as defined by claim 1, wherein the first power supply voltage is higher than the second power supply voltage.

17. The semiconductor memory device as defined by claim 1, wherein said semiconductor memory device is:
    a double data rate 1 (DDR1) SDRAM when the first power supply voltage is supplied to said semiconductor memory device, and
    a double data rate 2 (DDR2) SDRAM when the second power supply voltage is supplied to said semiconductor memory device.

18. The semiconductor memory device as defined by claim 1, wherein whether the first power supply voltage or the second power supply voltage is supplied to said semiconductor memory device is determined by a wiring in said semiconductor memory device.

19. The semiconductor memory device as defined by claim 1, wherein said semiconductor memory device is a synchronous RAM (SDRAM).

* * * * *